(12) United States Patent
Toda

(10) Patent No.: US 7,710,189 B2
(45) Date of Patent: May 4, 2010

(54) SEMICONDUCTOR DEVICE FOR RF SWITCHING

(75) Inventor: Tetsu Toda, Kanagawa (JP)

(73) Assignee: NEC Electronics Corporation, Kawasaka, Kanagawa (JP)

( * ) Notice: Subject to any disclaimer, the term of this patent is extended or adjusted under 35 U.S.C. 154(b) by 0 days.

(21) Appl. No.: 11/414,259

(22) Filed: May 1, 2006

(65) Prior Publication Data
US 2006/0267666 A1 Nov. 30, 2006

(30) Foreign Application Priority Data
May 27, 2005 (JP) ............................. 2005-155225

(51) Int. Cl.
*H03K 17/687* (2006.01)
(52) U.S. Cl. ........................ 327/434; 327/427
(58) Field of Classification Search ................. 327/427, 327/434
See application file for complete search history.

(56) References Cited

U.S. PATENT DOCUMENTS

| | | | | |
|---|---|---|---|---|
| 5,717,356 A | * | 2/1998 | Kohama | 327/427 |
| 5,767,721 A | * | 6/1998 | Crampton | 327/308 |
| 5,818,099 A | * | 10/1998 | Burghartz | 257/548 |
| 5,883,541 A | * | 3/1999 | Tahara et al. | 327/434 |
| 5,903,178 A | * | 5/1999 | Miyatsuji et al. | 327/308 |
| 6,201,455 B1 | * | 3/2001 | Kusunoki | 333/103 |
| 6,853,235 B2 | * | 2/2005 | Nakayama et al. | 327/379 |
| 6,903,596 B2 | * | 6/2005 | Geller et al. | 327/427 |
| 6,967,517 B2 | * | 11/2005 | Mizuno | 327/308 |
| 7,199,635 B2 | * | 4/2007 | Nakatsuka et al. | 327/308 |

FOREIGN PATENT DOCUMENTS

JP 2003-347553 12/2003

* cited by examiner

*Primary Examiner*—Lincoln Donovan
*Assistant Examiner*—Patrick O'Neill
(74) *Attorney, Agent, or Firm*—McGinn IP Law Group, PLLC

(57) ABSTRACT

A semiconductor switch according to an embodiment of the invention includes resistive members connected with a source and a drain witch are n-type diffusion layers formed in a P-well of an n-type MOSFET. When a gate of the n-type MOFET is turned off, a positive voltage is applied to a node between the resistive members for a reverse bias at a PN junction between the source and the drain, and the well. When the gate is turned on, the node between the resistive members is set to 0 V.

12 Claims, 5 Drawing Sheets

| ENHANCEMENT DEPLETION TYPE | CHANNEL TYPE | Bulk POTENTIAL | TERMINAL POTENTIAL IN ON/OFF STATES OF SWITCH ||||||||
|---|---|---|---|---|---|---|---|---|---|---|---|
| | | | ON (PRESENT INVENTION) ||| OFF (PRESENT INVENTION) ||| OFF (RELATED ART) |||
| | | | G | SD | Bulk | G | SD | Bulk | G | SD | Bulk |
| ENHANCEMENT | N | GROUND | + | 0 | 0 | 0 | 0 | 0 | 0 | 0 | 0 |
| | | VOLTAGE APPLICATION | 0 | - | - | - | - | - | - | - | - |
| | P | GROUND | - | 0 | 0 | 0 | 0 | 0 | 0 | 0 | 0 |
| | | VOLTAGE APPLICATION | 0 | + | + | + | + | + | + | + | + |
| DEPLETION | N | GROUND | >0 | + | 0 | - | ++ | 0 | 0 | + | 0 |
| | | VOLTAGE APPLICATION | + | 0 | + | 0 | + | + | + | 0 | + |
| | P | GROUND | <0 | - | 0 | + | -- | 0 | 0 | - | 0 |
| | | VOLTAGE APPLICATION | - | 0 | - | 0 | - | - | - | 0 | - |

0 · · · 0 POTENTIAL (GROUND) BUT FLOATING POTENTIAL AT SD IN CONVENTIONAL TRANSISTOR
>0 · · · 0 POTENTIAL (GROUND) OR POSITIVE POTENTIAL
<0 · · · 0 POTENTIAL (GROUND) OR NEGATIVE POTENTIAL
+ · · · POSITIVE POTENTIAL
++ · · · POSITIVE POTENTIAL HIGHER THAN POTENTIAL (+)
- · · · NEGATIVE POTENTIAL
-- · · · NEGATIVE POTENTIAL HIGHER THAN POTENTIAL (-)

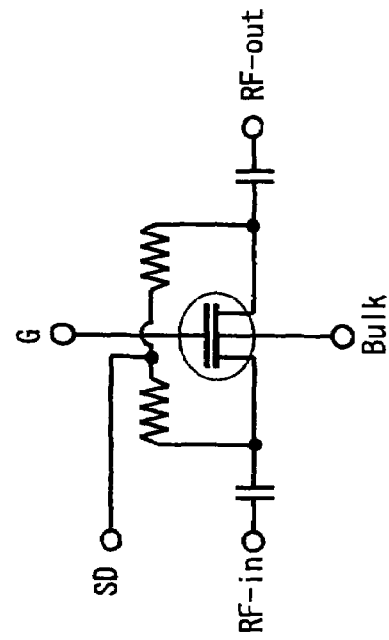

Fig. 5

SEMICONDUCTOR DEVICE FOR RF SWITCHING

BACKGROUND OF THE INVENTION

1. Field of the Invention

The present invention relates to a semiconductor device suitable for a semiconductor switch for switching an RF signal.

2. Description of Related Art

Existing switches for an RF signal are given below. For example, a PIN diode is used as a single-function switch. Further, a compound semiconductor is mainly used as a multifunctional or high-performance semiconductor switch albeit expensive. It is easy to provide greater functionality to a switch made up of an enhancement type nMOS transistor on an inexpensive Si substrate. However, the switch of this type has a disadvantage in that its performance, especially, isolation characteristic with high frequencies is inferior to that of the compound semiconductor and is required to improve its performance.

FIG. 6 is a circuit diagram showing a conventional switch made up of an enhancement type nMOSFET (hereinafter referred to as nMOSFET). Hereinafter, this semiconductor switch is referred to as Related Art 1. A source 121 and a drain 122 of an nMOSFET 100a are connected with an RF input terminal 111 and an RF output terminal 112, respectively. A capacitor 103 is connected between the source 121 and the RF input terminal 111 for cutting DC components. Likewise, a capacitor 104 is connected between the drain 122 and the RF output terminal 112 for cutting DC components. A backgate 125 of the nMOSFET is grounded. A gate terminal 120 is connected with a terminal for controlling on/off states of a switch (hereinafter referred to as control terminal) 114.

FIG. 7 is a sectional view of the nMOSFET. A diffusion layer 123 serving as a source of an n-type semiconductor and a diffusion layer 124 serving as a drain thereof are formed on the surface of a P-well 126 serving as a backgate of a p-type semiconductor. A gate oxide film 130 is formed above the P-well 126 and between the diffusion layer 123 as the source and the diffusion layer 124 as the drain, and a gate 129 is formed on the gate oxide film 130.

In this case, depletion layers 127 and 128 are formed at a PN junction between the diffusion layer 123 as the source and the P-well 126 and a PN junction between the diffusion layer 124 as the drain and the P-well 126, respectively. Thus, as shown in FIG. 8, in the nMOSFET, the depletion layers 127 and 128 at the PN junction define capacitances 107 and 108 between a source and a drain. Further, capacitances 109 and 110 are formed through the gate oxide film 130 between the source and the drain.

Now, an operational principle of the switch is described. In FIG. 6, when the switch is turned on, a positive voltage not lower than a threshold voltage VT is applied to the control terminal 114. As a result, the gate terminal 120 of the nMOSFET 100a is turned on. Then, an RF signal is output from the RF input terminal 111 to the RF output terminal 112 by way of the capacitor 103, the nMOSFET 100a, and the capacitor 104. When the switch is turned off, the control terminal 114 is set to 0 V. Thus, the transmission of the RF signal through the nMOSFET 100a is controlled by turning off the gate terminal 120 of the nMOSFET 100a.

Incidentally, as an example of the semiconductor switch, there is an SPST (Single Pole Single Throw) switch that incorporates a shunt circuit and a controlling inverter. FIG. 9 is a circuit diagram showing another conventional semiconductor switch (hereinafter referred to as Related Art 2). The semiconductor switch of this type is disclosed in Japanese Unexamined Patent Application Publication No. 2003-347553, for example.

The circuit includes a switching nMOSFET 100b provided between the RF input terminal 111 and the RF output terminal 112 as well as a shunt nMOSFET 200 provided between the RF output terminal 112 and a ground terminal 118. A control signal for switching between the switching nMOSFET 100b and the shunt nMOSFET 200 is input from the control terminal 114. The control terminal 114 is directly connected with the gate terminal 120 of the switching nMOSFET 100b as in the above case. On the other hand, the control terminal 114 is connected with a gate terminal 250 of the shunt nMOSFET 200 through an inverter 140. Incidentally, when the shunt nMOSFET 200 is turned on, an impedance is set much lower than an impedance of the output terminal 112 (for example, 50 Ω). In addition, the capacitors 103 and 104 for cutting DC components are inserted between the nMOSFET 100b and the RF input terminal 111 and between the nMOSFET 100b and the RF output terminal 112, respectively. A capacitor 105 for cutting DC components is inserted between the shunt nMOSFET 200 and the ground terminal 18.

An operation of the conventional semiconductor switch is described hereinbelow. When the switch is turned off, the control terminal 114 is set to 0 V, and the switching nMOSFET 100b is turned off. At this time, the inverter 140 applies a positive voltage to the gate of the shunt nMOSFET 200 to turn the shunt nMOSFET 200 on.

However, the inventors of this application find the following problems. That is, in the semiconductor switch of Related Art 1, when the switch is turned off, the control terminal 114 is set to 0 V to turn off the gate terminal 120 of the nMOSFET 100a. At this time, as shown in FIG. 8, the capacitances 107 to 110 are formed between the source and the drain. Therefore, the RF signal is unintentionally transmitted through these capacitances. In particular, the depletion layer capacitances 107 and 108 at the PN junction are generally larger than the gate oxide film capacitances 109 and 110 by one order or more, and become big factors behind the leakage of the signal. That is, the nMOSFET 100a of Related Art 1 has a problem in that the input RF signals are not completely blocked and are partially transmitted through the switching nMOSFET 100a.

In contrast, in the nMOSFET 100b of Related Art 2, the impedance of the shunt nMOSFET 200 is much lower than the impedance of the switching nMOSFET 100b. Hence, the RF signals are mainly transmitted toward the ground terminal 118. Accordingly, the switch including such a shunt circuit can suppress the leakage of the signal to the RF output terminal 112.

However, if a positive voltage is applied to the control terminal 114 when the switch is turned on, the switching nMOSFET 100b is conversely turned on. Then, the shunt nMOSFET 200 is turned off since the gate terminal 250 is set at 0 V. At this time, the input signals are output to the RF output terminal 112 and also leak through the shunt nMOSFET 200 in an off state, leading to a problem in that the output signals are reduced.

SUMMARY OF THE INVENTION

A semiconductor device according to an aspect of the present invention includes: a source and drain of a first conductivity type formed in a well of a second conductivity type, in which a reverse bias is applied to a portion between the source and the well, and the drain and the well when the gate is turned off.

According to the present invention, when the gate is turned off, the control unit applies a reverse bias to a portion between the source and the well, and the drain and the well. Hence, an area of a depletion layer formed at the junction can be increased. This makes it possible to reduce a capacitance at the junction between the source and the well and the junction between the drain and the well and to suppress the leakage of signals through a capacitance at the junction when the gate is turned off.

A semiconductor device according to another aspect of the present invention includes: a switching transistor having a source and drain of a first conductivity type formed in a well of a second conductivity type; and a shunt transistor having a source and drain of a third conductivity type formed in a well of a forth conductivity type, in which the switching transistor outputs an input signal by turning a gate on, and the shunt transistor is connected with an output side of the switching transistor, and when a gate of the switching transistor is turned on, a gate of the shunt transistor is turned off, and when the gate of the shunt transistor is turned off, a reverse bias is applied to a portion between the source and the well, and the drain and the well.

According to the present invention, the shunt transistor is provided, whereby even if the switching transistor is turned off, the signals are not output. Further, when the switching transistor is turned on, the shunt transistor is turned off. At this time, a voltage is applied such that the source and the drain are biased reversely to the well, making it possible to suppress the leakage of the signals to the shunt transistor. That is, according to the present invention, it is possible to provide a semiconductor device capable of suppressing leakage of RF signals at the time of turning on/off a switch.

BRIEF DESCRIPTION OF THE DRAWINGS

The above and other objects, advantages and features of the present invention will be more apparent from the following description taken in conjunction with the accompanying drawings, in which:

FIG. 5 illustrates a terminal potential in the case of applying plural MOSFETs to a semiconductor switch of the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, embodiments of the present invention are described in detail with reference to the accompanying drawings. The embodiments are achieved by applying the present invention to an RF semiconductor switch made up of an enhancement type nMOSFET.

First Embodiment

Figure 1:
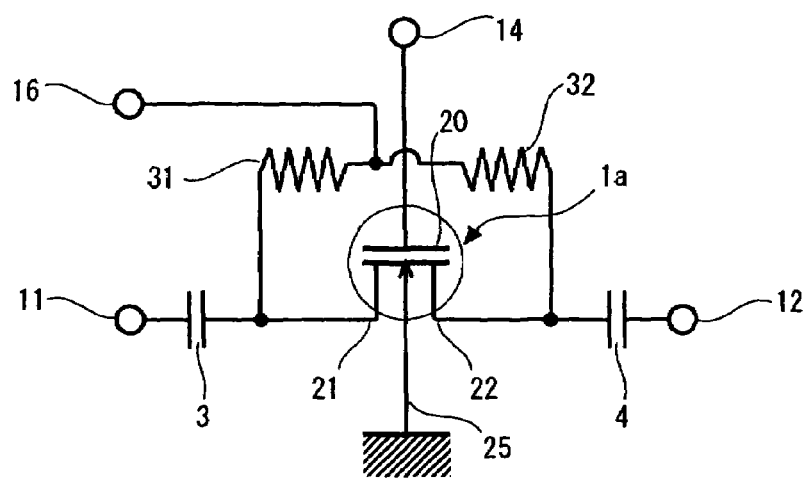
FIG. 1 is a circuit diagram showing a semiconductor switch according to a first embodiment of the present invention.

FIG. 1 is a circuit diagram showing a semiconductor switch according to a first embodiment of the present invention. An RF input terminal 11 and an RF output terminal 12 are connected with a source 21 and a drain 22 of an nMOSFET 1a, respectively. A capacitor 3 for cutting DC components is connected between the source 21 and the RF input terminal 11. Likewise, a capacitor 4 for cutting DC components is connected between the drain 22 and the RF output terminal 12. Further, a backgate 25 of the nMOSFET is grounded, and a gate terminal 20 is connected with a terminal (hereinafter referred to as "control terminal") 14 for inputting a gate control signal for controlling on/off states of a switch (gate) which is applied to the gate terminal 20.

In this embodiment, in addition to the above components, a terminal 16 for applying a positive voltage (impedance control signal) to the source 21 and the drain 22 is provided. The terminal 16 is connected with the source 21 and the drain 22 of the nMOSFET 1a. At this time, as shown in FIG. 1, the source 21 and the drain 22 are connected through resistors 31 and 32, and the terminal 16 is connected with a node between the resistor 31 and the resistor 32. Values of the resistors 31 and 32 are set much larger than the impedance of the nMOSFET 1a in a gate-off state. Incidentally, the resistors 31 and 32 may be replaced by inductors having an impedance much higher than that of the nMOSFET 1a.

Figure 2:
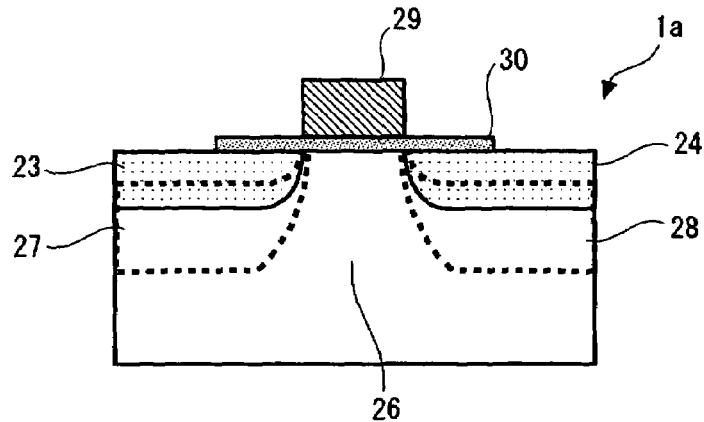
FIG. 2 is a sectional view showing an nMOSFET in the semiconductor switch of the first embodiment.

FIG. 2 is a sectional view showing the nMOSFET 1a. A diffusion layer 23 serving as a source of an n-type semiconductor and a diffusion layer 24 serving as a drain thereof are formed in the surface of a P-well 26 serving as a backgate of a p-type semiconductor. Further, a gate oxide film 30 is formed on the P-well 26 and between the diffusion layer 23 serving as a source and the diffusion layer 24 serving as a drain, and a gate 29 is formed on the gate oxide film 30.

Next, an operation of the semiconductor switch of this embodiment is described. When the switch is turned on, a positive voltage not lower than a threshold voltage VT as a gate control signal is applied to a control terminal 14. As a result, the gate 29 of the nMOSFET 1a is turned on. At the same time, the terminal 16 (impedance control signal) is set to 0 V. In this case, as in the conventional case, RF signals are output from the RF input terminal 11 to the RF output terminal 12 through MOSFET 1a. Here, in this embodiment, the resistors 31 and 32 are inserted between the input terminal 11 and the terminal 16 and between the output terminal 12 and the terminal 16, respectively, so the leakage of signals to the terminal 16 can be prevented.

Figure 3:
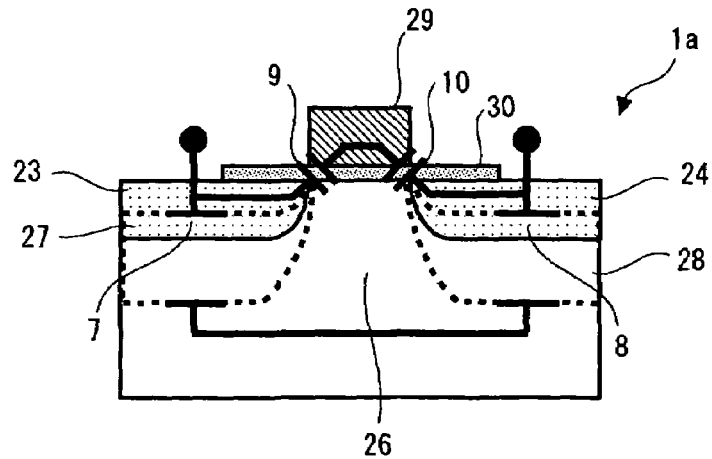
FIG. 3 shows a depletion layer capacitance formed in the nMOSFET of the semiconductor switch of the first embodiment.

Further, when the switch is turned off, the control terminal 14 (gate control signal) is set to 0 V, and the gate of the nMOSFET 1a is turned off. At the same time, a positive voltage as the impedance control signal is applied from the terminal 16. At this time, a PN junction between the n-type diffusion layer 23 as the source of the nMOSFET 1a and the n-type diffusion layer 24 as the drain thereof, and the P-well 26 is reversely biased. Thus, areas of depletion layers 27 and 28 at the PN junction become wider than areas in the case where a positive voltage is not applied, that is, the switch is turned on. As a result, a junction capacitance 7 of the diffusion layer 23 serving as a source and a junction capacitance 8 of the diffusion layer 24 serving as a drain as shown in FIG. 3 can be reduced. Accordingly, when the switch is turned off, the leakage of RF signals through the capacitances 7 and 8 at the PN junction can be suppressed.

Further, in this embodiment, a circuit for applying a positive voltage as an impedance control signal to the source 21 and the drain 22 has the resistors 31 and 32 having a sufficient large value. Hence, the leakage of signals through a circuit connected with the terminal 16 can be prevented. Incidentally, when the switch is turned off, a positive voltage applied as the impedance control signal to the source 21 and the drain 22 is set to a breakdown voltage of the PN junction or lower.

In this embodiment, a source-drain capacitance is reduced by applying a positive voltage to the source 21 and the drain 22 of the nMOSFET only when the switch is turned off, and the leakage of the RF signals at the time of turning the switch off is suppressed, making it possible to improve isolation characteristics of the switch.

That is, if the positive voltage is applied to the source 21 and the drain 22 of the nMOSFET 1a, the depletion layers 27 and 28 at the PN junction between the diffusion layer 23 serving as a source and the P-well 26 and between the diffusion layer 24 serving as a drain and the P-well 26 expand. Therefore, the capacitances 7 and 8 thereof can be reduced. The RF signals transmitted through the capacitances 7 and 8 can be reduced by minimizing the capacitances 7 and 8. Based on this fact, the positive voltage is applied to the source 21 and the drain 22 of the nMOSFET 1a used as the switch only when the switch is turned off. This makes it possible to suppress the leakage of the RF signals and improve the isolation characteristics of the switch.

Incidentally, this embodiment describes a switch example called an "SPST switch" with one-input/one-output. However, even if an SPDT (Single Pole Double Threw: one-input/two-output) switch or an SP3T (Single Pole Triple Threw: one-input/three-output) switch is used, similar beneficial effects can be attained due to similar configuration and operation of the switch.

Second Embodiment

Figure 4:
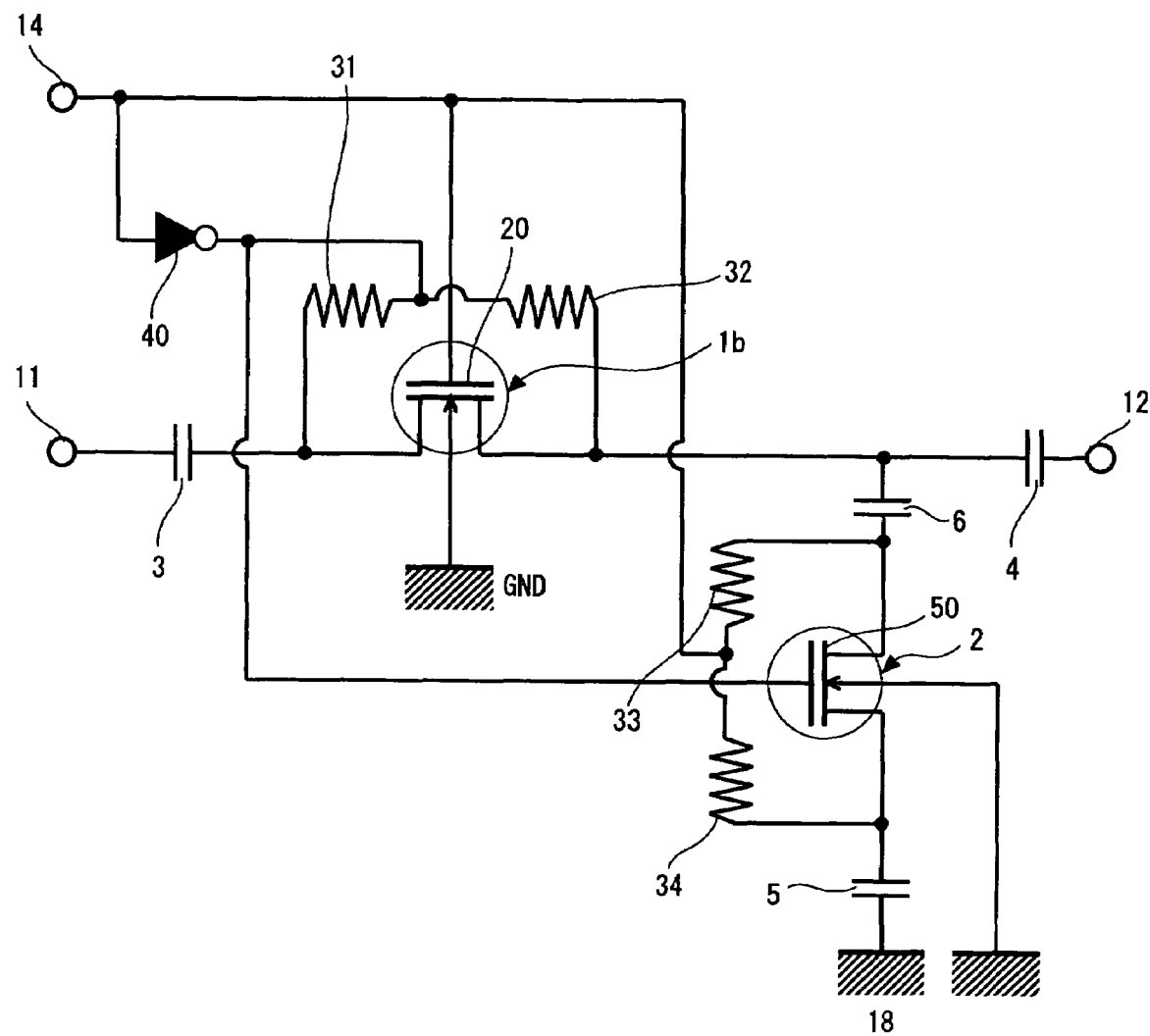
FIG. 4 is a circuit diagram showing a semiconductor switch according to a second embodiment of the present invention.
Figure 6:
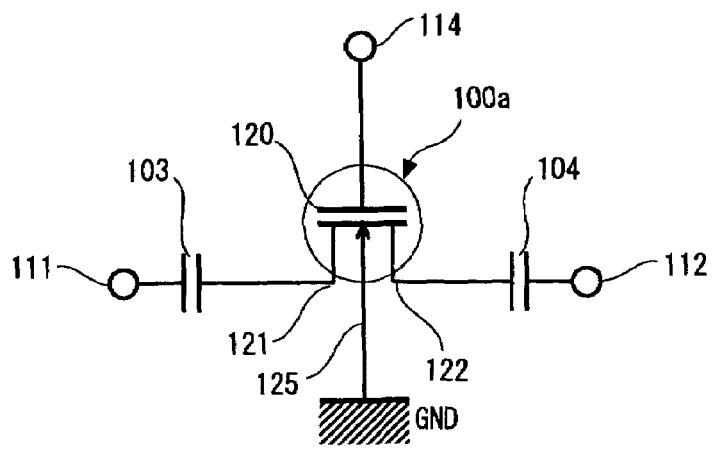
FIG. 6 is a circuit diagram showing a semiconductor device of Related Art 1.
Figure 7:
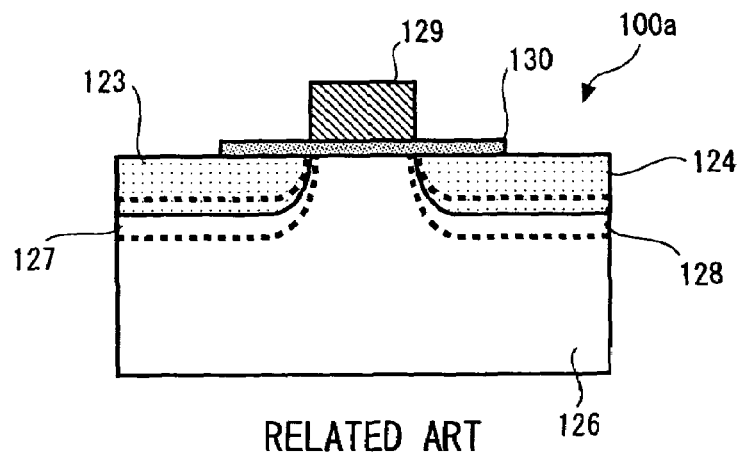
FIG. 7 is a sectional view showing an nMOSFET of Related Art 1.
Figure 8:
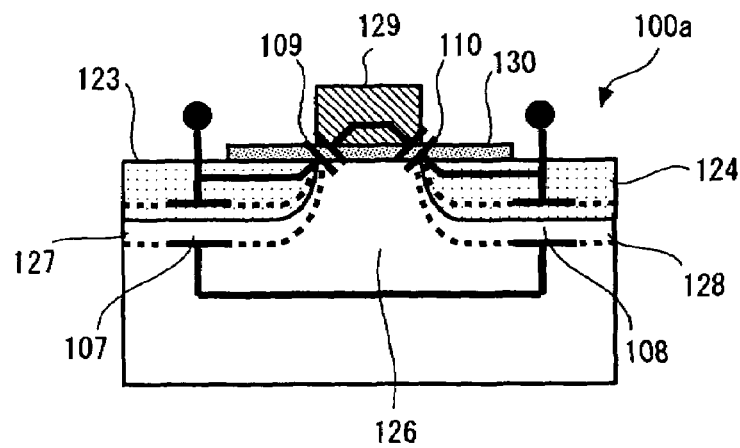
FIG. 8 shows a depletion layer capacitance and a gate oxide film capacitance formed in the nMOSFET of Related Art 1.
Figure 9:
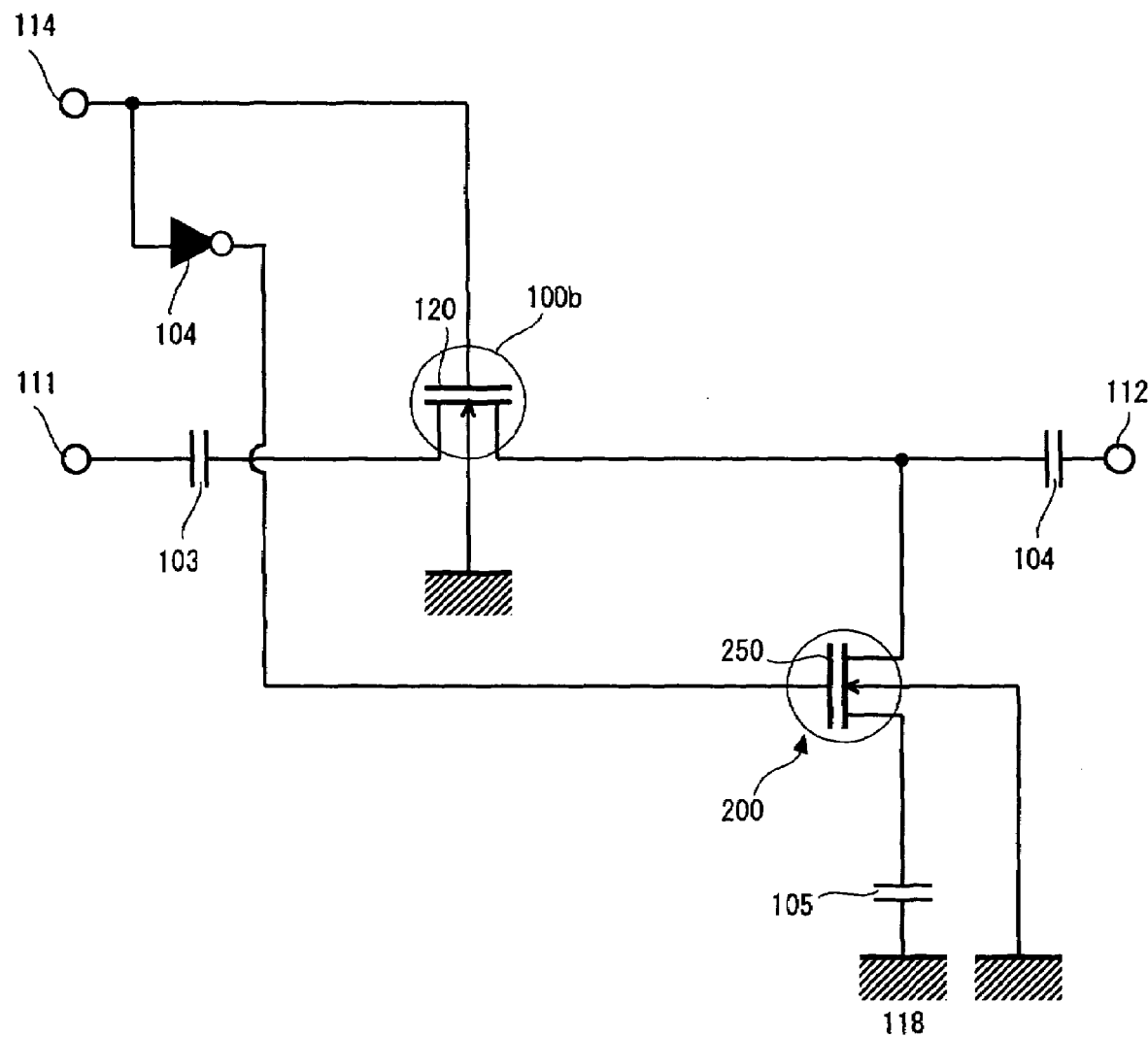
FIG. 9 is a circuit diagram showing a semiconductor device of Related Art 2.

FIG. 4 is a circuit diagram showing a semiconductor switch according to a second embodiment of the present invention. This embodiment is achieved by applying the present invention to an SPST switch that incorporates a shunt circuit. Incidentally, in this embodiment of FIG. 4, the same components as those of the first embodiment of FIG. 1 are denoted by identical reference numerals, and their detailed description is omitted here.

The semiconductor switch of this embodiment includes an switching nMOSFET 1b provided between the RF input terminal 11 and the RF output terminal 12 and in addition, a shunt nMOSFET 2 provided between the RF output terminal 12 and the ground terminal 18. A control signal for switching between the switching nMOSFET 1b and the shunt nMOSFET 2 is input from the control terminal 14. Similar to the first embodiment, the control terminal 14 is directly connected with the gate terminal 20 of the switching nMOSFET 1b. Meanwhile, the control terminal 14 is connected with a gate terminal 50 of the shunt nMOSFET 2 through an inverter 40.

Further, as in the first embodiment, the resistors 31 and 32 as second resistive members are connected between the source and the drain of the switching nMOSFET 1b. Then, a node between the resistor 31 and the resistor 32 as a second node is connected with the control terminal 14 through the inverter 40. Further, resistors 33 and 34 as first resistive members are connected between the source and the drain of the shunt nMOSFET 2. Then, a node between the resistors 33 and 34 as a first node is connected with the control terminal 14. An impedance of the resistors 31 and 32, and an impedance of the resistors 33 and 34 are set much higher than that at the time of turning off a gate of the nMOSFET 1b and a fate of the nMOSFET 2. Further, an impedance at the time of turning on the shunt nMOSFET 2 is set much lower than an impedance of the output terminal 12 (for example, 50 Ω).

Further, as in the first embodiment, capacitors 3 and 4 for cutting DC components are inserted between the nMOSFET 1b and the RF input terminal 11 and between the nMOSFET 1b and the RF output terminal 12, respectively. Further, a capacitor 5 for cutting DC components is inserted between the shunt nMOSFET 2 and the ground terminal 18. Furthermore, a capacitor 6 for cutting DC components is inserted between the resistors 32 and 33.

In this embodiment, when the switch is turned on, a positive voltage as a gate control signal is applied to the control terminal 14 to turn the switching nMOSFET 1b on and turn the shunt nMOSFET 2 off. At the same time, a positive voltage as an impedance control signal is applied to the source and the drain of the shunt nMOSFET 2. By applying the positive voltage to the source and the drain of the shunt nMOSFET 2, a source-drain capacitance of the shunt nMOSFET 2 is reduced, and the transmission of the RF signals through the capacitance can be suppressed.

That is, in this embodiment, the leakage of the RF signals through the shunt nMOSFET 2 at the time of turning the switch on can be suppressed, which produces an effect of eliminating a loss of output signals.

On the other hand, when the switch is turned off, the control terminal 14 (gate control signal) is set to 0 V to thereby turn off the nMOSFET 1b and turn on the shunt nMOSFET 2. At the same time, a positive voltage as an impedance control signal is applied to the source and the drain of the nMOSFET 1b in an off-state to thereby reduce a source-drain capacitance. Accordingly, the signal leakage in the nMOSFET 1b can be suppressed, and due to a synergistic effect of the shunt circuit, the leakage of the signals to the output terminal 12 can be further suppressed as compared with the conventional case.

In this embodiment, a positive voltage is applied to the source and the drain of the shunt nMOSFET 2 as well when the gate is turned off. Thus, a source-drain capacitance is reduced and the leakage of RF signals is suppressed, making it possible to reduce a loss of output signals. Further, the use of the inverter enables the sharing of the control terminal 14, and thus simpler control than the first embodiment is realized.

Incidentally, the present invention is not construed as being limited to the above embodiments alone, and needless to say, various modifications can be made within the scope of the present invention. For example, this embodiment describes the case of using the nMOSFET, but similar beneficial effects can be also attained using a pMOSFET. Further, the above description is focused on the enhancement type MOSFET, but a depletion type may be used. Moreover, the enhancement type, the depletion type, the p-type, and the n-type may be, of course, used in combination.

FIG. 5 shows an example of a voltage applied to each terminal in the case where a P-channel transistor, an N-channel transistor, an enhancement type transistor, or a depletion type transistor is used as the transistor of the first embodiment, and the switching transistor and the shunt transistor of the second embodiment. In a circuit diagram of FIG. 5, reference symbol G denotes the gate terminal 20; 50, a voltage to be applied; SD, a voltage applied to a node between the resistors 31 and 32 and a node between the resistors 33 and 34; FR-in, the input terminal 11; FR-out, the output terminal 12; and Bulk, a voltage applied to a backgate. For comparison purposes, a gate voltage (G), a source-drain voltage (SD), and a voltage applied to a backgate (Bulk) in an off-state of the conventional transistor are also illustrated. If the voltage (G) applied to the gate terminal or the voltage (SD) applied to the node between the resistors is appropriately changed, whichever transistors are used in combination, a semiconductor switch similar to that of the above embodiments can be obtained.

Incidentally, when the enhancement type N-channel MOSFET as described in the above embodiment is used, this MOSFET excels the other transistors in that only a single positive power supply is required as a power supply and high-speed operation is ensured, and thus this MOSFET is most preferable. Further, as described in the second embodiment, in the case of using the semiconductor switch with a shunt circuit, however transistors are combined, the control terminal of two or more systems or one system and an inverter are provided.

It is apparent that the present invention is not limited to the above embodiment that may be modified and changed without departing from the scope and spirit of the invention.

What is claimed is:

1. A semiconductor device, comprising:
    a source and drain of a first conductivity type formed in a well of a second conductivity type;
    a gate formed between the source and the drain through a gate oxide film; and
    a control unit for applying a reverse bias to portions between the source and the well and the drain and the well when the gate is turned off and for applying, when the gate is turned on, a substantially zero differential bias to the portions between the source and the well and between the drain and the well.

2. The semiconductor device according to claim 1, wherein the control unit includes resistive members connected with the source and the drain, and when the gate is turned on, a potential at a node between the resistive members is set to 0 V, and when the gate is turned off, the reverse bias is applied to the node between the resistive members.

3. The semiconductor device according to claim 2, wherein the control unit includes:
    a gate control terminal for inputting a gate control signal for controlling on/off states of the gate; and
    an impedance control terminal for inputting an impedance control signal applied to the node between the resistive members.

4. The semiconductor device according to claim 2, wherein the control unit includes:
    a gate control terminal for inputting a gate control signal for controlling on/off states of the gate; and
    an inverter connected with the gate control terminal, and
    an impedance control signal applied to the node between the resistive members is used as the gate control signal applied through the inverter.

5. The semiconductor device according to claim 2, wherein an impedance of the resistive members is higher than an impedance through said source and drain at a time of turning the gate off.

6. The semiconductor device according to claim 1, wherein the semiconductor device comprises an enhancement type MOSFET, and functions as an RF switch.

7. A semiconductor device, comprising:
    a switching transistor having a source and drain of a first conductivity type formed in a well of a second conductivity type; and
    a shunt transistor having a source and drain of a third conductivity type formed in a well of a fourth conductivity type,
    wherein the switching transistor outputs an input signal by turning a gate on, and
    the shunt transistor is connected with an output side of the switching transistor, and when a gate of the switching transistor is turned on, a gate of the shunt transistor is turned off, and, when the gate of the shunt transistor is turned off, a reverse bias is applied to portions between the source and the well and the drain and the well and, when the gate of the shunt transistor is turned on, a substantially zero differential bias is applied to the portions between the source and the well and between the drain and the well.

8. The semiconductor device according to claim 7, further comprising first resistive members connected with the source and the drain of the shunt transistor,
    wherein when the gate of the switching transistor is turned on, the reverse bias is applied to a first node between the first resistive members connected with the source and the drain of the shunt transistor, and the gate of the shunt transistor is turned off.

9. The semiconductor device according to claim 8, further comprising second resistive members connected with the source and the drain of the switching transistor,
    wherein when the gate of the switching transistor is turned off, the reverse bias is applied to a second node between the second resistive members connected with the source and the drain of the shunt transistor, and the gate of the shunt transistor is turned on.

10. The semiconductor device according to claim 7, wherein the switching transistor and the shunt transistor have the same conductivity type, and
    the semiconductor device further comprises a control terminal for inputting a control signal for controlling on/off states of the gate of the switching transistor and controlling a potential at a first node of the shunt transistor.

11. The semiconductor device according to claim 10, further comprising an inverter connected with the control terminal,
    wherein a control signal applied through the inverter is used to control on/off states of the gate of the shunt transistor and a potential at a second node of the switching transistor.

12. A semiconductor device, comprising: a source and drain of a first conductivity type formed in a well of a second conductivity type;
    a gate formed between the source and the drain through a gate oxide film; and
    a control unit for applying a reverse bias to portions between the source and the well and the drain and the well when the gate is turned off, thereby causing depletion layers between said source and said well and between said drain and said well to expand when said gate is turned off, and when said gate is turned on, said control unit applies a substantially zero differential bias to the portions between the source and the well and between the drain and the well for causing said depletion layers to subsequently contract when said gate is turned on.

* * * * *